United States Patent
Iwata

(10) Patent No.: US 6,600,658 B2
(45) Date of Patent: Jul. 29, 2003

(54) ELECTRICAL JUNCTION BOX

(75) Inventor: Yoshifumi Iwata, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/101,699

(22) Filed: Mar. 21, 2002

(65) Prior Publication Data

US 2002/0101724 A1 Aug. 1, 2002

Related U.S. Application Data

(63) Continuation of application No. 09/392,224, filed on Sep. 9, 1999, now Pat. No. 6,430,054.

(30) Foreign Application Priority Data

Sep. 10, 1998 (JP) ............................................ 10-256270

(51) Int. Cl.$^7$ ................................................ H05K 5/02
(52) U.S. Cl. ........................ 361/752; 361/736; 174/50; 439/76.2
(58) Field of Search ................................ 361/752, 736, 361/826; 439/76.1, 76.2, 74, 34, 44, 76, 949; 174/50, 52.1

(56) References Cited

U.S. PATENT DOCUMENTS

| | | | | |
|---|---|---|---|---|
| 4,972,295 A | * | 11/1990 | Suguro ........................ 361/386 |
| 5,229,922 A | | 7/1993 | Muramatsu et al. ........ 361/736 |
| 5,295,842 A | * | 3/1994 | Ozaki et al. ................... 439/76 |
| 5,703,757 A | * | 12/1997 | Hayes et al. ................. 361/752 |
| 5,928,004 A | * | 7/1999 | Sumida et al. .............. 439/76.2 |
| 5,995,380 A | * | 11/1999 | Maue et al. ................. 361/826 |
| 6,116,916 A | * | 9/2000 | Kasai ......................... 439/76.2 |
| 6,290,509 B1 | * | 9/2001 | Hattori et al. .............. 439/76.2 |

FOREIGN PATENT DOCUMENTS

JP          4-61417          5/1992

* cited by examiner

Primary Examiner—David Martin
Assistant Examiner—Dameon E. Levi
(74) Attorney, Agent, or Firm—Armstrong, Westerman & Hattori, LLP

(57) ABSTRACT

The electrical junction box has a case, which accommodates a printed circuit board provided in a lower side of the case. The case also receives an electrical wiring circuit and a busbar circuit disposed in an upper side of the case so as to be parallel to the printed circuit board. Wiring harness connectors are mounted on a side wall of the case, and relay connectors are positioned on the side wall or another side wall of the case. The side walls are perpendicular to the printed circuit board. The wiring harness connectors are connected to inner circuits including the printed circuit, the busbar circuit, and the electrical wiring circuit. The case has a top cover, a bottom cover, and a horizontal intermediate partition. The intermediate partition is provided with the electrical wire circuit on an under surface of the partition so as to be opposed to the printed circuit. The upper surface of the intermediate partition is provided with the busbar circuit.

2 Claims, 4 Drawing Sheets

ELECTRICAL JUNCTION BOX

This application is a continuation of prior application Ser. No. 09/392,224 filed Sep. 9, 1999, now U.S. Pat. No. 6,430,054.

BACKGROUND OF THE INVENTION

1. Field of the Invention

The present invention relates to an electrical junction box used for mutual connection of wiring harnesses arranged in an automobile vehicle, particularly to such an electrical junction box having a reduced height or a smaller size.

2. Prior Art

A conventional electrical junction box has a case generally accommodating circuit boards like a busbar arranged board and is mounted with fuse blocks, relay blocks, and connectors for wiring harnesses on outer surfaces of the box. The electrical junction box is fitted to a panel in an engine room or a dashboard of an automobile vehicle for on/off operation of electrical circuits to provide an organized arrangement of the wiring harnesses.

On the other hand, the number of electrical equipment installed in the vehicle such as an air bag, a navigator, an air conditioner, an audio unit, etc. are increasing for improvement of safety and amenity of cars. Thus, an electronic unit having a function circuit for controlling such electrical equipment is positively provided together with an electrical junction box.

FIG. 4 shows a connection structure of an electrical junction box and an electronic unit, which is disclosed in Japanese Utility Model Application Laid-open No. H. 4-137428. Denoted 50 is an electronic unit, and 60 an electrical junction box. The electronic unit 50 has upper and lower cases 52, 53 accommodating a printed circuit board 51 provided with a function circuit. The board 51 is mounted via an elastic block 54 so as to be movable in a horizontal plane as shown by an arrow P. The board 51 is provided with a plurality of electrical elements 55, 56 and a connector 57 for the electrical junction box.

The electrical junction box 60 has a case 61 accommodating a plurality of busbar circuit boards 64 consisting of a busbar 62 and a dielectric board 63. The case 61 is also fitted with a plurality of connectors (not shown) for connection of wiring harnesses on an outer wall thereof. The case 61 has an upper surface 61a fitted with a compound connector 65 associated with the junction box connection connector 57. On an under surface 61b of the case, there are fitted a plurality of relay connectors 66 each for removably receiving a relay 67. Denoted 62a is a tab-shaped connector terminal led from the busbar 62, and denoted 68 is an L-shaped fitting plate unitedly formed with the case 61. The fitting plate has a horizontal plate 68a that will be joined to a vehicle panel (not shown). The junction box connection connector 57 is directed for connection in a perpendicular direction to the under surface 61b of the case.

The electronic unit 50 overlies the electrical junction box 60 so that the junction box connection connector 57 can mate with the unit connection connector 65. The electronic unit 50 has a height $h_1$ for accommodating a plurality of electric parts mounted on the printed circuit board 51 such as the electrical elements 55 and the connector 57. Meanwhile, the electrical junction box 60 has a height $h_2$ that can accommodate the layered busbar circuits 64 and the relays 67.

Thus, the combined height h of the electronic unit 50 and the electrical junction box 60 is equal to $h_1+h_2$. This configuration is difficult to reduce the combined height h or to accomplish a more compact design. If the relay 67 is installed in a horizontal position within the case of the electronic unit 50, a larger accommodation space will be required for the unit to install all the plurality of parts including the electrical elements 55, 56.

SUMMARY OF THE INVENTION

In view of the above-described subject, an object of the present invention is to provide an electrical junction box which is of a reduced height type and compact so as to be easily installed even in a restricted narrow space of a car.

For achieving the object, a first aspect of the present invention is an electrical junction box which includes
  a case,
  a printed circuit board disposed in a lower side of the case,
  an electrical wiring circuit and a busbar circuit which are disposed in an upper side of the case so as to be parallel to the printed circuit board,
  at least one wiring harness connector mounted on a side wall of the case, and
  at least one relay connector for receiving a relay and positioned on the side wall or another side wall of the case.

The side walls are perpendicular to the printed circuit board, and the wiring harness connector is connected to an inner circuit including the printed circuit, the busbar circuit, and the electrical wiring circuit.

A second aspect of the present invention is an electrical junction box having a case. The case includes
  a first side wall for fitting the case on a vehicle panel and
  a second side wall for fitting a fuse, the second wall being opposed to the first side wall.

The other side walls of the case are used for connecting an inner circuit provided in the case to a wiring harness and for mounting a relay connector to receive a relay.

In the first aspect of the invention, the relay connector is disposed on a case side wall where the wiring harness connector is also positioned. This allows a significantly smaller height of the electrical junction box, enabling an easy arrangement of the junction box in a narrow space.

In the second aspect of the invention, the walls of the case other than the first and second walls are used for connecting the wiring harness and for mounting the relay connector. Thus, the relay and the wiring harness are attached or detached with ease in a direction different from the case fitting panel, improving workability thereof.

In a third additional aspect of the present invention of electrical junction box, the case has a top cover, a bottom cover, and a horizontal intermediate partition. The intermediate partition is provided with an electrical wire circuit on an under surface of the partition so as to be opposed to the printed circuit. Furthermore, a top surface of the intermediate partition is provided with a busbar circuit.

The third aspect of the invention allows a compact arrangement in the box to reduce more the height of the electrical junction box, because the electrical wire circuit is positioned to be opposed to the printed circuit board. Furthermore, since the intermediate partition of the electrical junction box is used as an electric element mounting board having a busbar circuit, a conventional separate mounting board is not required.

DETAILED DESCRIPTION OF THE PREFERRED EMBODIMENT

Figure 1:
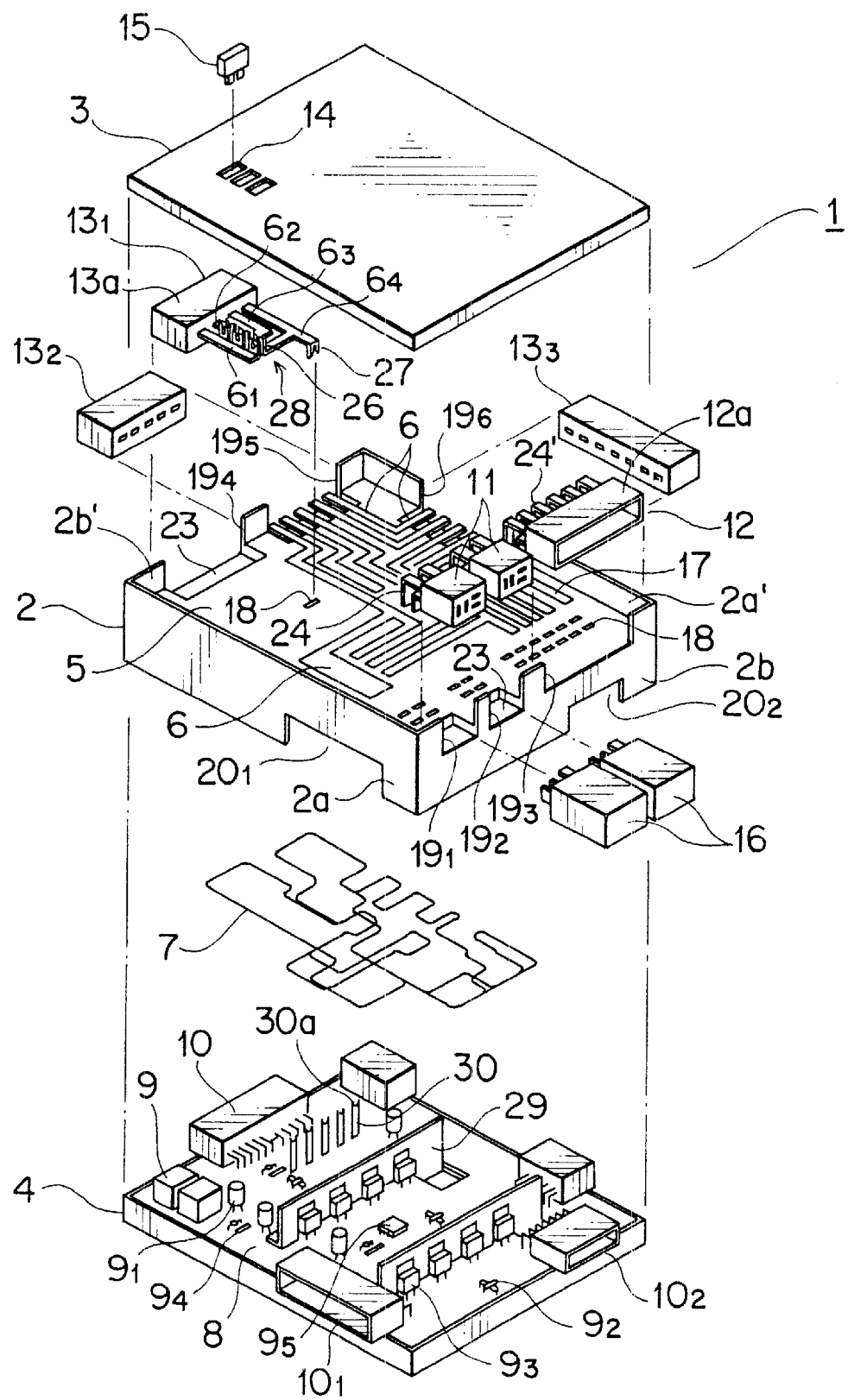
FIG. 1 is an exploded perspective view showing an electrical junction box according to an embodiment of the present invention.
Figure 2:
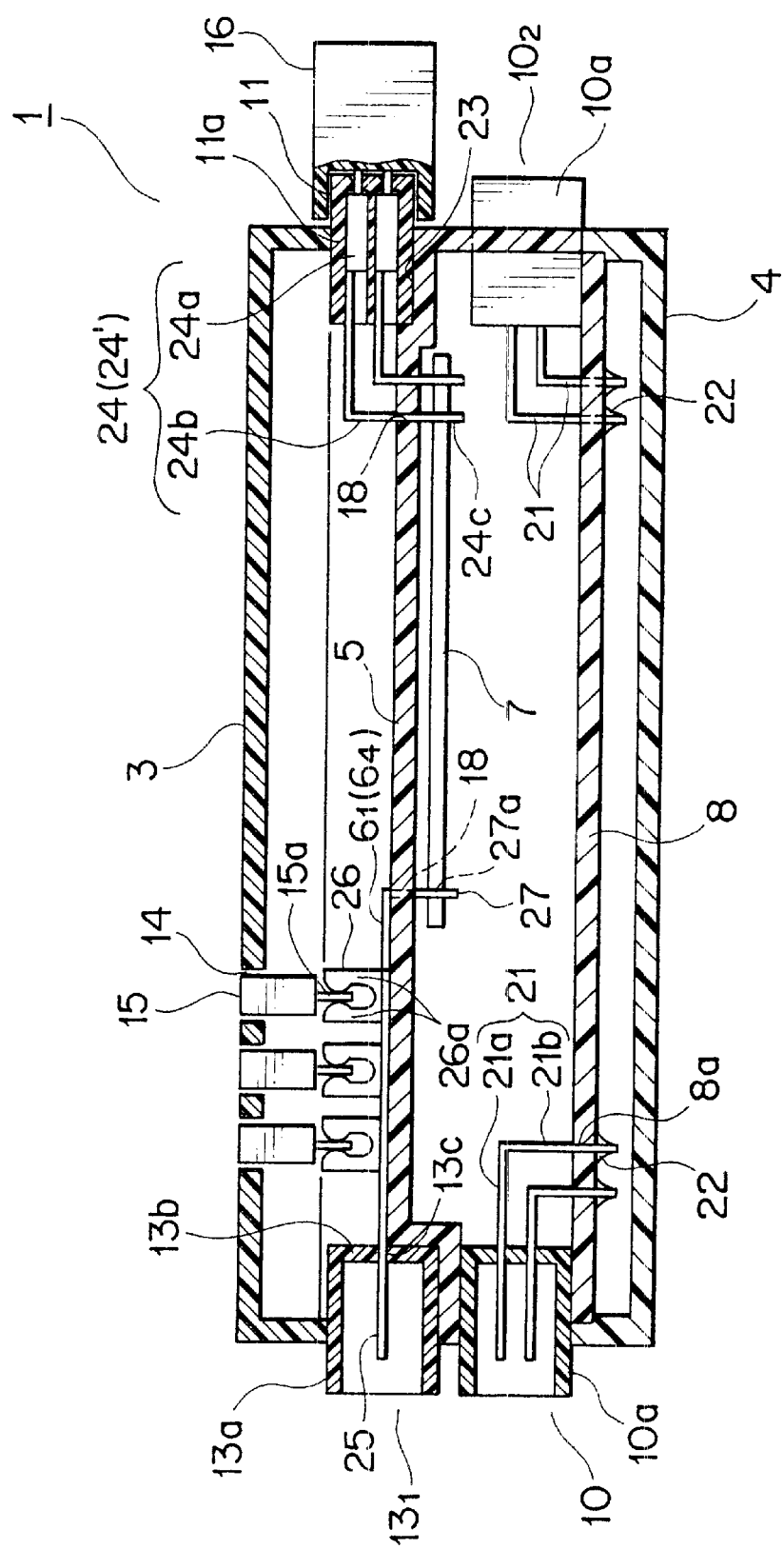
FIG. 2 is a longitudinal sectional view showing primary parts of the junction box of FIG. 1 in an assembled condition.
Figure 3A:
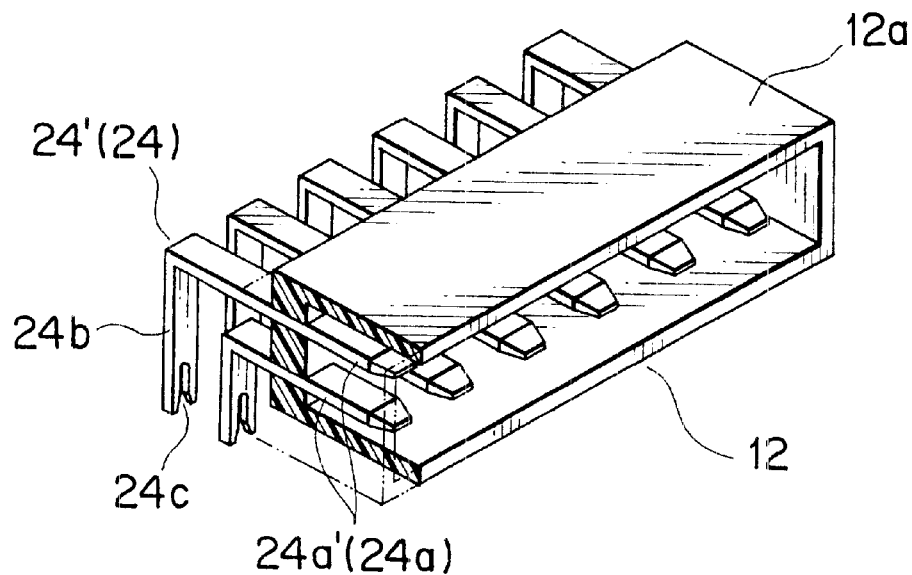
FIG. 3A and FIG. 3B are partial enlarged perspective views each showing connection terminals for electrical wiring circuits or busbars of FIG. 1.
Figure 3B:
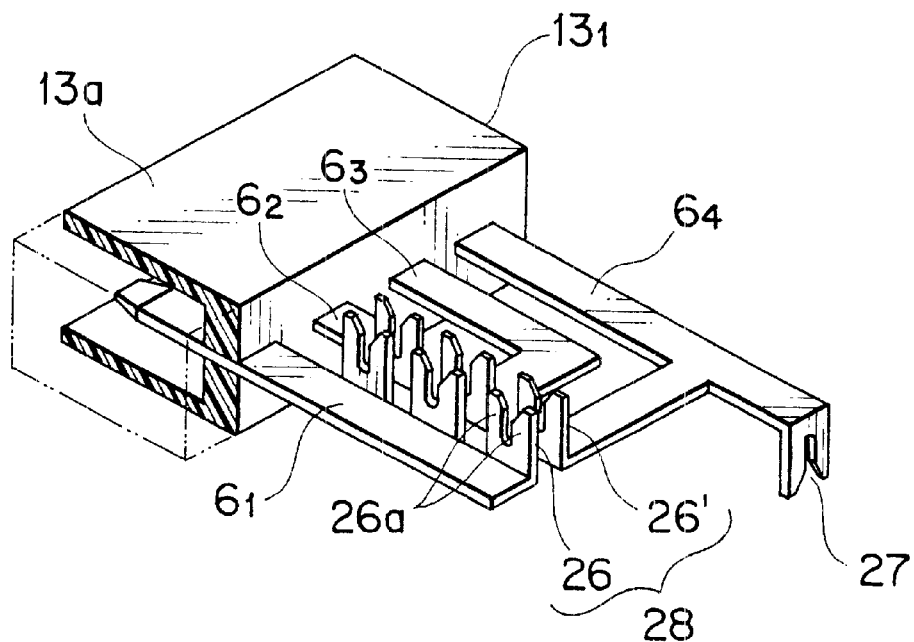
Figure 4:
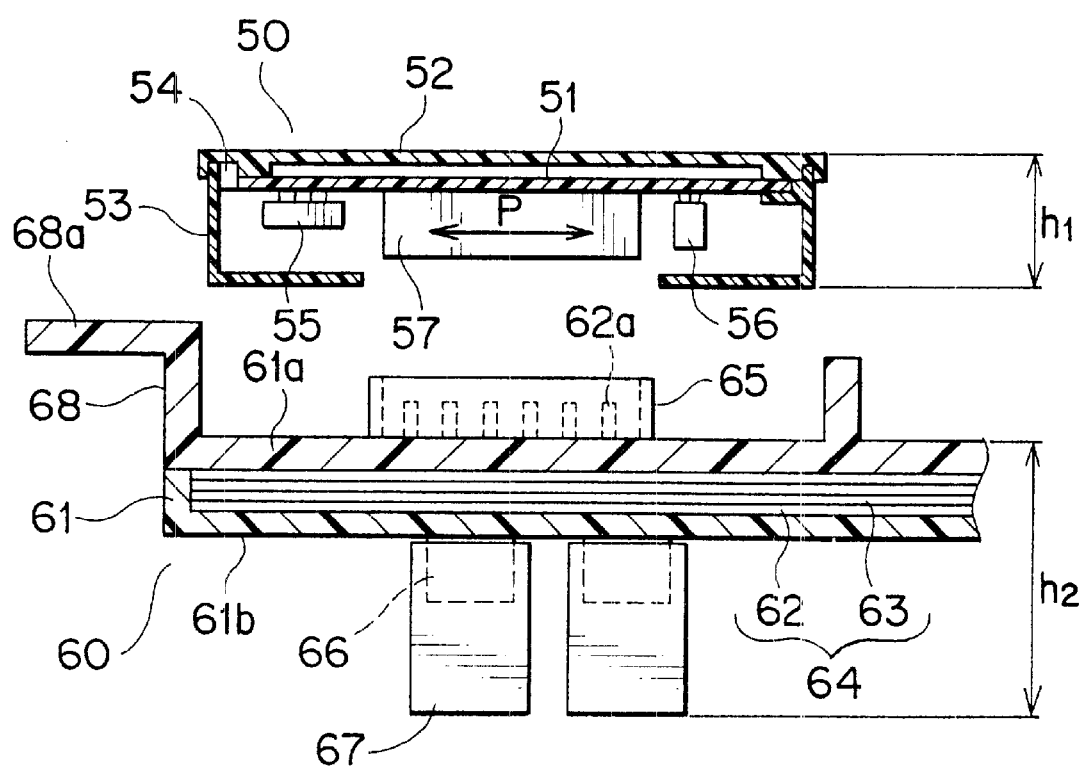
FIG. 4 is an explanatory illustration of a conventional electrical junction box.

Referring to FIGS. 1 to 3, an embodiment of the present invention will be discussed.

In these figures, denoted 1 is an electrical junction box which has a box-shaped case wall 2 made of insulation synthetic resin, a top cover 3, and a bottom cover 4. The bottom cover 4 has a first surface for fitting the junction box to a vehicle panel. Meanwhile, the top cover 3 has a second surface opposed to the first surface. On side walls of the case wall 2 other than the first and second surfaces, various types of connectors 10 to 13 and relays 16 are provided, which will be described in detail later.

The case wall 2 has an inner intermediate partition 5 which is an electric element fitting board. On a top surface of the intermediate partition 5, there are disposed a plurality of busbars $6_1$ to $6_4$ (or representatively denoted by numeral 6) each having a desired pattern. Meanwhile, on an under surface of the partition 5, there is mounted an electrical wiring circuit 7 composing an inner circuit. In a space between the intermediate partition 5 and the bottom cover 4, there are provided a printed circuit board 8 served as a function circuit and a plurality of electrical elements 9 (or $9_1$ to $9_5$).

The top cover 3 has a plurality of fuse insertion openings 14 for mounting fuses 15 from outside to connect them to the busbars 6. Denoted 16 is a relay received in a relay connector 11. Denoted 17 is a busbar mounting slot formed in the intermediate partition 5, and a numeral 18 denotes a terminal through hole. By way of the terminal through hole 18, a press-fitting part 24b of a connection terminal 24 or the like is inserted as described later.

In side walls of the case wall 2, there are formed a plurality of upper and lower cut-out openings 19 ($19_1$, $19_2$, and so on) and 20 ($20_1$, $20_2$, and so on). In the lower openings 20 are mounted connectors 10 ($10_1$, $10_2$, and so on) connected to the inner printed circuit board 8. In the upper openings 19 are mounted a plurality of the relay connectors 11, a connector 12 connected to the electrical wiring circuit 7, and connectors 13 ($13_1$, $13_2$, and so on) connected to the busbars 6. These connectors 10, 12, and 13 compose wiring harness connectors for external wiring harnesses (not shown).

The case wall 2 consists of a pair of opposing longitudinal side walls 2a, 2a' and a pair of end walls 2b, 2b'. The side wall 2a has a lower cut-out opening $20_1$ for receiving the connector $10_1$ directly mounted on the printed circuit board 8.

The connector $10_1$ has a housing 10a that is fitted on the printed circuit board 8 with securing means like screws (not shown). The housing 10a receives an L-shaped connection terminal 21. The connection terminal 21 has a terminal pin 21a at one end thereof and a connection conductor piece 21b at the other end thereof. The terminal pin 21a is secured to the housing 10a. The connection conductor piece 21b passes through a hole 8a of the printed circuit board 8 to extend in a rear side of the board 8 and is secured on a conductor land (not shown) of a circuit by soldering 22.

The end wall 2b perpendicularly adjacent to the side wall 2a is formed with the upper cut-out openings $19_1$, $19_2$, and $19_3$ and the lower cut-out opening $20_2$. The upper openings $19_1$, $19_2$ each receive the relay connector 11, and the opening $19_3$ receives the connector 12. The lower opening $20_2$ receives the connector $10_2$.

In relation to each of the upper openings $19_1$, $19_2$, the intermediate partition 5 is formed with an engagement recess 23 for positioning a housing 11a of the connector 11. The housing 11a is preliminarily fitted with two L-shaped connection terminals 24 having terminal pins 24a which are parallel disposed to be secured thereon in the same way as the housing 10a. The other ends of the L-shaped terminals 24 are press-fitting pieces 24b which are forcedly downwardly inserted into through holes 18 of the intermediate partition 5 to be secured thereto. Each piece 24b has a leading end formed with a slot 24c for connecting an electrical wiring circuit 7 thereto by press-fitting.

Another cut-out opening $19_3$ does not have a recess such as the engagement recess 23 so that a housing 12a of the connector 12 is directly placed on a top surface of the intermediate partition 5. The connector 12 is mounted with connection terminals 24' similar to the connection terminals 24 except that connector terminal ends 24a' of the terminals 24' are of a pin type different from the receptacle type terminal ends 24a. The connection terminals 24' are connected to the electrical wiring circuits 7 by press-fitting.

Each relay connector 11 is correctly positioned by the engagement recess 23 of the housing 11a, and each connection terminal 24 is secured to the intermediate partition 5. Accordingly, the relay connector 11 is securely attached to the case wall 2 with ease.

On the end wall 2b' opposed to the end wall 2b, there are formed upper cut-out openings $19_4$ and $19_5$, and on the rear side wall 2a', there is formed an upper cut-out opening $19_6$. The cut-out openings $19_4$ to $19_6$ each are formed with an engagement recess 23, in which connectors $13_1$ to $13_3$ are mounted to be connected to the busbars 6. The connectors $13_1$ to $13_3$ each have a housing 13a which is positioned in an engagement recess 23 as described above. In each of the connectors $13_1$ to $13_3$, a terminal 25 of each busbar 6 is mounted to be secured therein.

Each busbar 6 is arranged to be inserted into the busbar mounting slot 17 of the intermediate partition 5. The busbar 6 has a terminal tab 25 at one end thereof and also has a press-fitting terminal 27 or a fuse terminal 26 (26') at the other end.

In the embodiment shown in FIG. 1, the busbar $6_1$ is used for distributing electrical power. The busbar $6_1$ has a connector terminal 25 at one end thereof and a plurality of fuse terminals 26 at the other end. The fuse terminals 26 are longitudinally equally spaced and directed upward. In the embodiment, there are three fuse terminals 26, each of which has a pair of elastic pinching pieces 26a. The busbars $6_2$ to $6_4$ each have a connector terminal 25 at one end thereof and a fuse terminal 26' at the other end. The fuse terminals 26' are directed upward and aligned horizontally in line. Furthermore, the busbar $6_4$ has a downwardly directed press-fitting terminal 27 branched from a horizontal intermediate portion thereof. Each connector terminal 25 of the busbars $6_1$ to $6_4$ is inserted into the housing 13a which has been positioned in the engagement recess 23 through a hole 13c formed in a rear wall 13b of the housing 13a to be secured to the rear wall 13b. In the other end side of the busbars $6_1$ to $6_4$, each of the fuse terminals 26 and 26' is arranged so as to be opposed to the corresponding one to compose a fuse mounting part 28. The press-fitting terminal 27 of the busbar $6_4$ is extending downward from the intermediate partition 5 through the hole 18. A slot 27a of the terminal 27 receives an electrical wiring circuit 7 to secure it therein by press-fitting. Other groups of busbars 6 for the connectors $13_2$ and $13_3$ are configured as corresponding to each related circuit pattern in the same way as the busbars $6_1$ to $6_4$. Hence, those busbars will not be discussed further.

Referring again to FIG. 1, the printed circuit board 8 is provided with a plurality of electrical elements 9 including condensers $9_1$, resistors $9_2$, $9_3$, diodes $9_4$, and an integrated circuit $9_5$ on an upper surface thereof and a wiring circuit (not shown) on a rear surface thereof. Preferably, comparatively high temperature generating elements such as the resistor $9_3$ are mounted on a heat radiation plate 29 upwardly provided on the printed circuit board 8. The printed circuit board 8 and the electrical elements 9 compose a so-called function circuit.

The printed circuit board 8 is provided with a plurality of upright long piece terminals 30 for connection of the upper and lower circuits. That is, the connection terminals 30 connect the printed circuit board 8 to the busbars 6 or the electrical wiring circuit 7. Each terminal 30 has a press-fitting slot 30a at an upper end thereof and has a connection conductor piece (not shown) at a lower end thereof in the same way as the connection terminal 21. The connection conductor piece is connected to a desired circuit pattern of the printed circuit board 8 in the same way as the connection conductor piece 21b.

Hereinafter, assembling steps of the electrical junction box will be discussed.

First, in the case wall 2, there are arranged busbars $6_1$, $6_2$, and so on corresponding to a plurality of busbar mounting slots 17 of the intermediate partition 5. For example, the press-fitting terminal 27 of the busbar $6_4$ is extended downward from the through hole 18 to be secured thereto by press fitting. Preferably, each busbar 6 inserted into a busbar mounting slot 17 is secured thereto by bonding.

Next, in the cut-out openings $19_1$ to $19_3$ of the side walls of the case wall 2, the relay connectors 11 and the connector 12 connected to the electrical wiring circuit 7 are mounted. In the same way as the busbar 6, each press-fitting part 24b of the connection terminals 24, 24' is extended downward from the through hole 18 to be secured thereto by pressure fitting. The housings 13a of the connectors 13 are mounted into the cut-out openings $19_4$ to $19_6$. On the mounting, the connector terminals 25 are inserted into the through holes 13c of the housings 13a after securing the busbars 6 to the busbar mounting slots 17, or the busbars 6 are secured to the slots after insertion of the connector terminals 25 into the housings 13a.

Then, the electrical wiring circuit 7 is arranged to provide a comparatively smaller current circuit and a signal circuit together with the printed circuit board 8.

That is, from an under surface of the intermediate partition 5, a large number of press-fitting pieces 24b of the connection terminals 24, 24' and press-fitting terminals 27 of the busbars 6 are extending through the holes 18.

By arranging the electrical wiring circuit 7 to be secured to the slots 24c and 27a of the press-fitting pieces, a desired circuit pattern is obtained. The wire arrangement may be carried out by utilizing a wire arrangement machine (not shown) having a wire handling head movable laterally and longitudinally, for example, as disclosed in Japanese Patent Registered NO. 2505924.

On arrangement of the busbars 6 and the electrical wiring circuit 7, the busbars 6 and the electrical wiring circuit 7 are received within the case wall 2 to be well protected from damage due to unintentional contact with exterior equipment. Thus, transfer and temporary storage of sub-assemblies of the junction box will be easy.

Then, on the bottom cover 4, the printed circuit board 8 mounted with a plurality of electrical elements 9 is set, and the printed circuit board 8 is connected to the busbars 6 and the electrical wiring circuit 7 via the connection terminals 30 located therebetween. Thereafter, the printed circuit board 8 is secured to the case wall 2, for example, with fixing screws. Thereby, in the lower cut-out openings 20 ($20_1$, $20_2$, and so on), the connectors 10 of the printed circuit board 8 are inserted and secured thereto.

At last, in the upper side openings of the case wall 2, the relays 16 are connected to the relay connectors 11, and the fuses 15 are connected to the fuse mounting part 28 consisting of the fuse terminals 26, 26' of the busbars 6. The top cover 3 is placed on the case wall 2 to be secured thereto by conventional lock means or by fixing with screws. Thus, assembling of the junction box is completed. The presence or not of the fuse 15 will be easily recognized through the fuse insertion hole 14. The mounting of the relay 16 may be carried out after fitting of the top cover 3. The fuse 15 may be furnished through the fuse insertion hole 14 of the top cover 3.

What is claimed is:

1. An electrical junction box having a case, said case comprising a bottom cover, free of electrical components, and arranged for fitting said case on a vehicle panel and a top cover being provided with at least one fuse insertion opening, said top cover being opposed to said bottom cover, wherein the other side walls of said case, which are not opposed to said bottom cover, are each provided with at least one connector for an inner circuit provided in said case for connecting to a wiring harness and at least one side wall has at least one relay connector for receiving a relay.

2. An electrical junction box as set forth in claim 1, wherein said case has said top cover, said bottom cover, and an intermediate partition parallel to said bottom cover, said intermediate partition being provided with an electrical wire circuit on an under surface of said partition so as to be opposed to a printed circuit, and a top surface of said intermediate partition being provided with a busbar circuit.

* * * * *